US011121080B2

(12) United States Patent
Sasaki et al.

(10) Patent No.: US 11,121,080 B2
(45) Date of Patent: Sep. 14, 2021

(54) SEMICONDUCTOR DEVICE

(71) Applicant: Samsung Electronics Co., Ltd., Suwon-si (KR)

(72) Inventors: Yuichiro Sasaki, Suwon-si (KR); Sungkeun Lim, Suwon-si (KR); Pil-Kyu Kang, Suwon-si (KR); Weonhong Kim, Suwon-si (KR); Seungha Oh, Suwon-si (KR); Yongho Ha, Suwon-si (KR); Sangjin Hyun, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/809,788

(22) Filed: Mar. 5, 2020

(65) Prior Publication Data
US 2020/0365509 A1 Nov. 19, 2020

(30) Foreign Application Priority Data
May 16, 2019 (KR) .................. 10-2019-0057543

(51) Int. Cl.
*H01L 23/522* (2006.01)
*H01L 23/50* (2006.01)
*H01L 23/528* (2006.01)

(52) U.S. Cl.
CPC .......... *H01L 23/5226* (2013.01); *H01L 23/50* (2013.01); *H01L 23/5286* (2013.01)

(58) Field of Classification Search
CPC .. H01L 23/5226; H01L 23/50; H01L 23/5286

USPC ........................................................ 257/774
See application file for complete search history.

(56) References Cited

U.S. PATENT DOCUMENTS

| 7,833,844 | B2 * | 11/2010 | Hashimoto | ......... H01L 23/5258 |
| | | | | 438/132 |
| 8,101,500 | B2 | 1/2012 | Wang et al. | |
| 9,105,889 | B2 | 8/2015 | Fanelli | |
| 9,741,691 | B2 | 8/2017 | Lim et al. | |
| 9,953,877 | B2 | 4/2018 | Huang et al. | |
| 10,032,707 | B2 | 7/2018 | Lai et al. | |
| 10,636,739 | B2 * | 4/2020 | Beyne | ................. H01L 23/5226 |
| 2012/0292777 | A1 | 11/2012 | Lotz | |
| 2018/0145030 | A1 | 5/2018 | Beyne et al. | |
| 2018/0204776 | A1 | 7/2018 | Huang et al. | |
| 2018/0374791 | A1 | 12/2018 | Smith et al. | |

FOREIGN PATENT DOCUMENTS

KR   10-2018-0131502 A   12/2018

* cited by examiner

*Primary Examiner* — Tu-Tu V Ho
(74) *Attorney, Agent, or Firm* — Harness, Dickey & Pierce, P.L.C.

(57) ABSTRACT

A semiconductor device includes a semiconductor layer having a first surface and a second surface opposite to the first surface, an active pattern on the first surface, the active pattern including a source/drain region, a power rail electrically connected to the source/drain region, and a power delivery network on the second surface, the power delivery network electrically connected to the power rail. The semiconductor layer includes an etch stop dopant, and the etch stop dopant has a maximum concentration at the second surface.

20 Claims, 19 Drawing Sheets

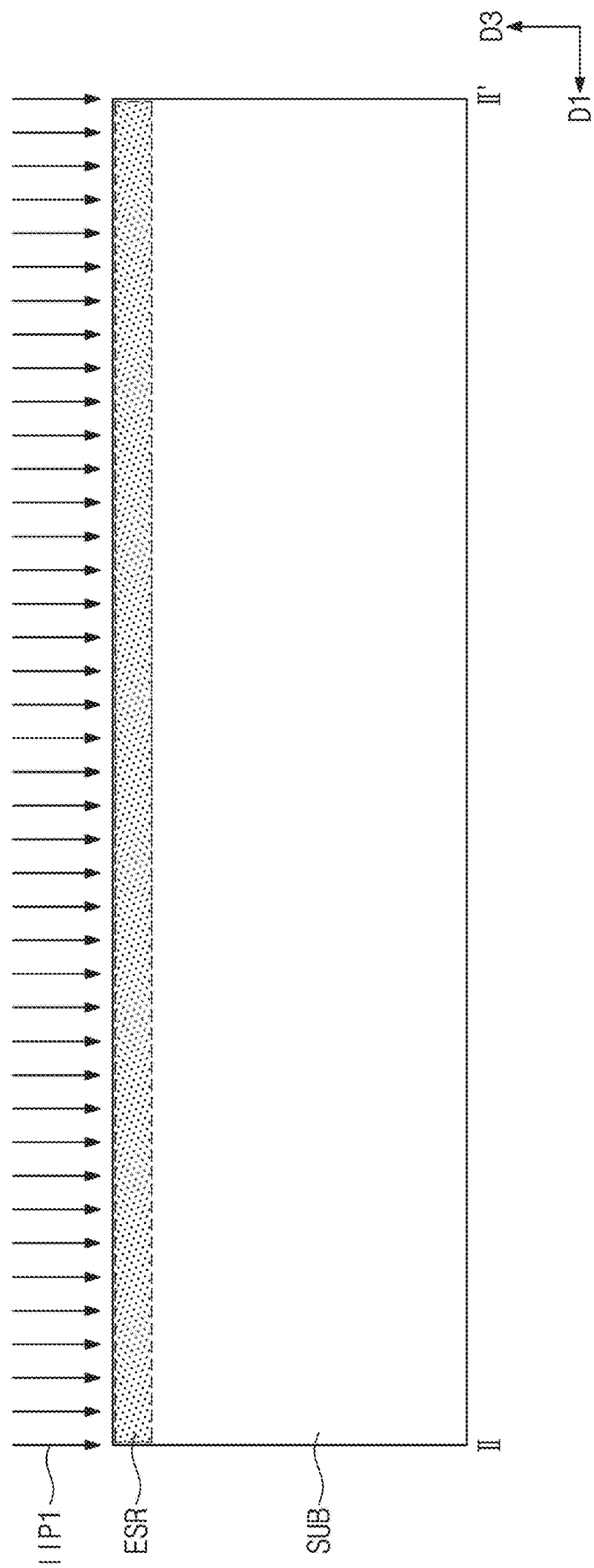

US 11,121,080 B2

SEMICONDUCTOR DEVICE

CROSS-REFERENCE TO RELATED APPLICATION

This U.S. non-provisional patent application claims priority under 35 U.S.C. § 119 to Korean Patent Application No. 10-2019-0057543, filed on May 16, 2019, in the Korean Intellectual Property Office, the disclosure of which is hereby incorporated by reference in its entirety.

BACKGROUND

Example embodiments of the inventive concepts relate to a semiconductor device and, more particularly, to a semiconductor device including a field effect transistor and a method of manufacturing the same.

Semiconductor devices are widely used in an electronic industry because of their small sizes, multi-functional characteristics, and/or low manufacturing costs. Semiconductor devices may be categorized as any one of semiconductor memory devices storing logical data, semiconductor logic devices processing logical data, and hybrid semiconductor devices having both the function of the semiconductor memory devices and the function of the semiconductor logic devices. Semiconductor devices with excellent characteristics have been increasingly demanded with the development of an electronic industry. For example, high-reliable, high-speed and/or multi-functional semiconductor devices have been increasingly demanded. To satisfy these demands, semiconductor devices have been highly integrated and structures of semiconductor devices have been more and more complicated.

SUMMARY

Some example embodiments of the inventive concepts may provide a semiconductor device capable of improving integration density and reliability.

According to some example embodiments, a semiconductor device includes a semiconductor layer having a first surface and a second surface opposite to the first surface, an active pattern on the first surface, the active pattern including a source/drain region, a power rail electrically connected to the source/drain region, and a power delivery network on the second surface, the power delivery network electrically connected to the power rail, wherein the semiconductor layer includes an etch stop dopant, and the etch stop dopant has a maximum concentration at the second surface.

According to some example embodiments, a semiconductor device includes a semiconductor layer having a first surface and a second surface opposite to the first surface, a transistor on the first surface, an upper insulating layer on the transistor, an upper interconnection line in the upper insulating layer, a lower insulating layer on the second surface, and a lower interconnection line in the lower insulating layer, wherein the semiconductor layer includes an etch stop dopant, and a concentration of the etch stop dopant decreases from the second surface toward the first surface.

According to some example embodiments, a semiconductor device includes a semiconductor layer having a first surface and a second surface opposite to the first surface, a transistor on the first surface, a lower insulating layer on the second surface, and a lower interconnection line in the lower insulating layer, wherein the semiconductor layer includes an etch stop dopant and a concentration of the etch stop dopant increases from the first surface to the second surface, has a maximum value at the second surface, and may be drastically reduced in the lower insulating layer.

BRIEF DESCRIPTION OF THE DRAWINGS

The inventive concepts will become more apparent in view of the attached drawings and accompanying detailed description.

FIGS. 4A to 4J are cross-sectional views taken along the line II-II' of FIG. 1 to illustrate a method of manufacturing a semiconductor device, according to some example embodiments of the inventive concepts.

DETAILED DESCRIPTION

Figure 1:
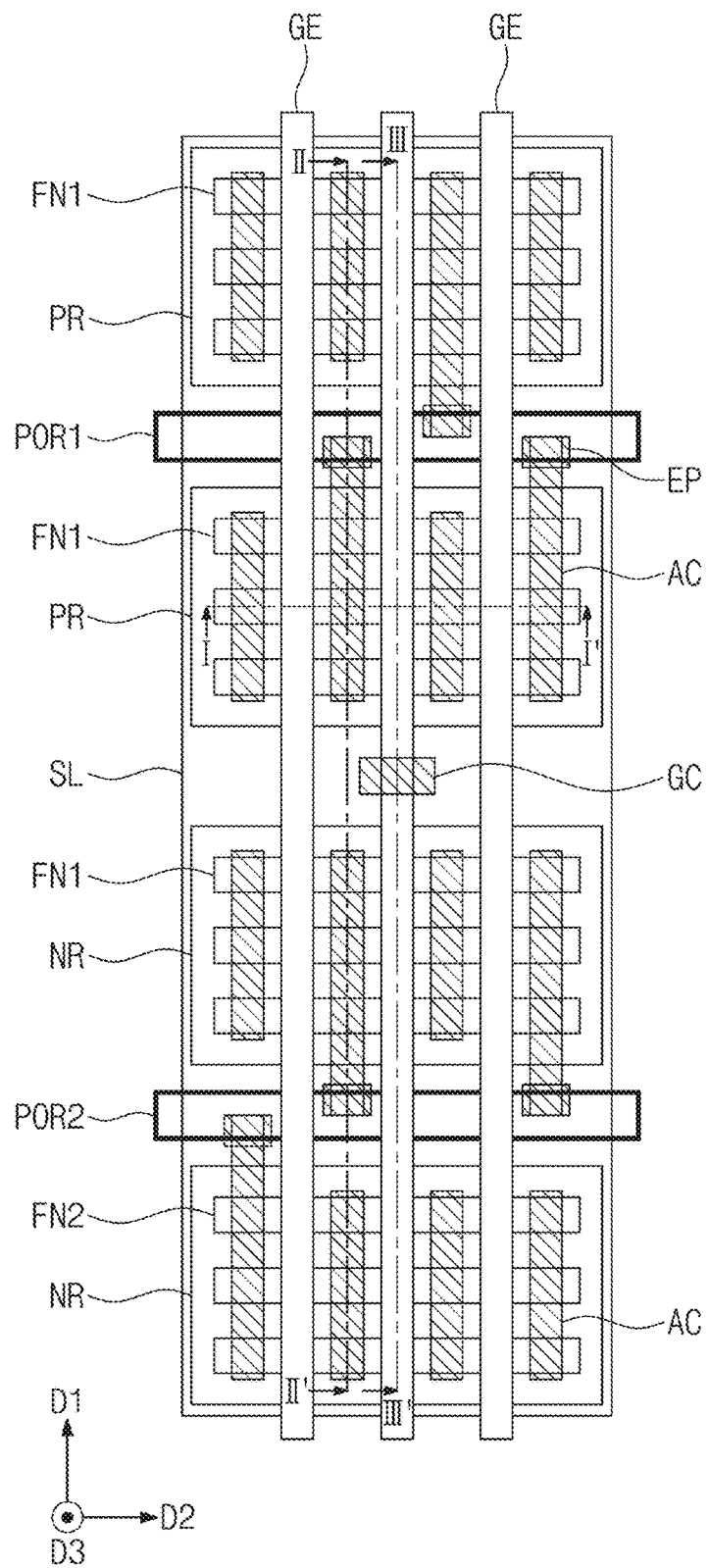
FIG. 1 is a plan view illustrating a semiconductor device according to some example embodiments of the inventive concepts.
Figure 2A:
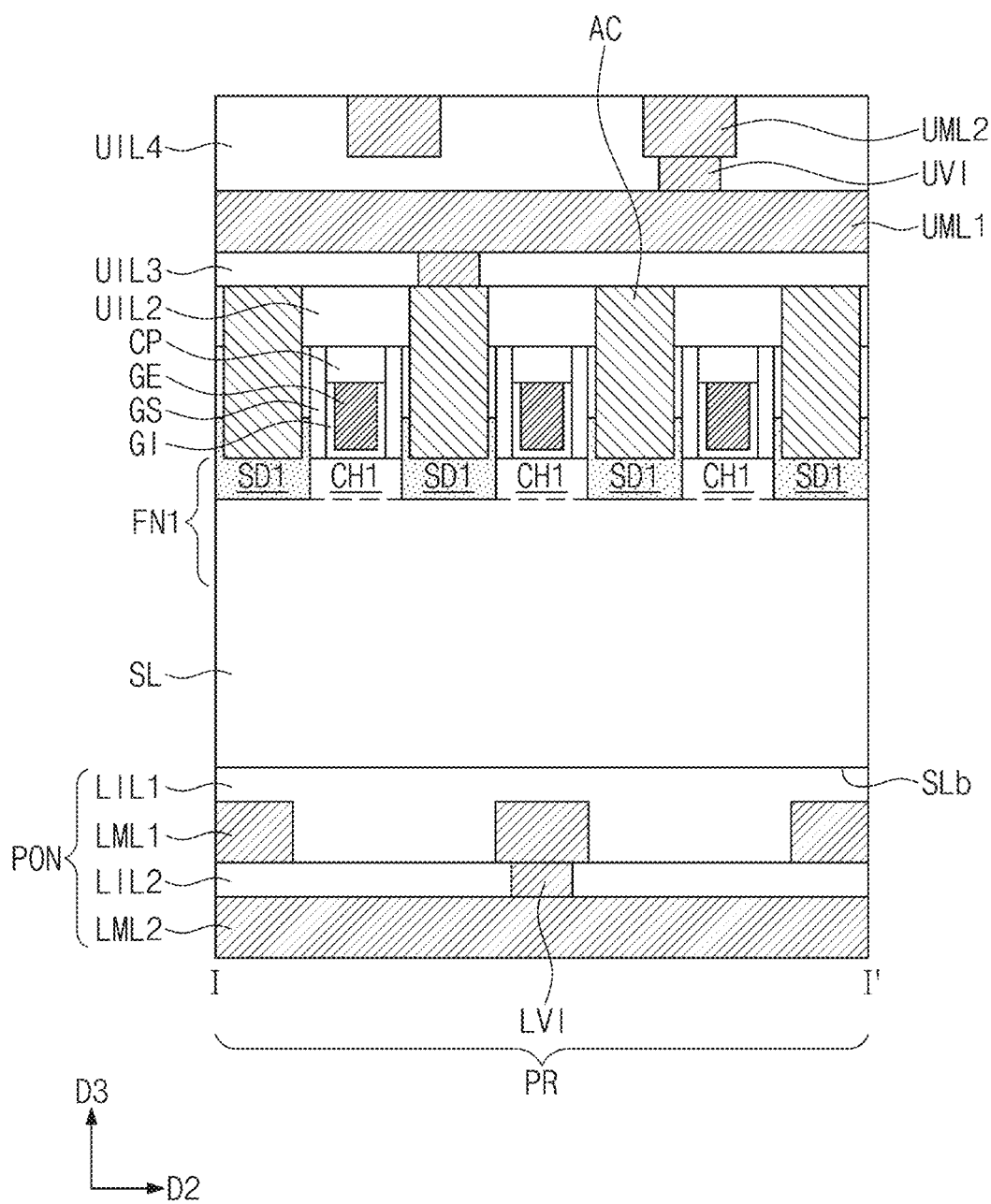
FIGS. 2A, 2B and 2C are cross-sectional views taken along lines I-I', II-II' and III-III' of FIG. 1, respectively.
Figure 2B:
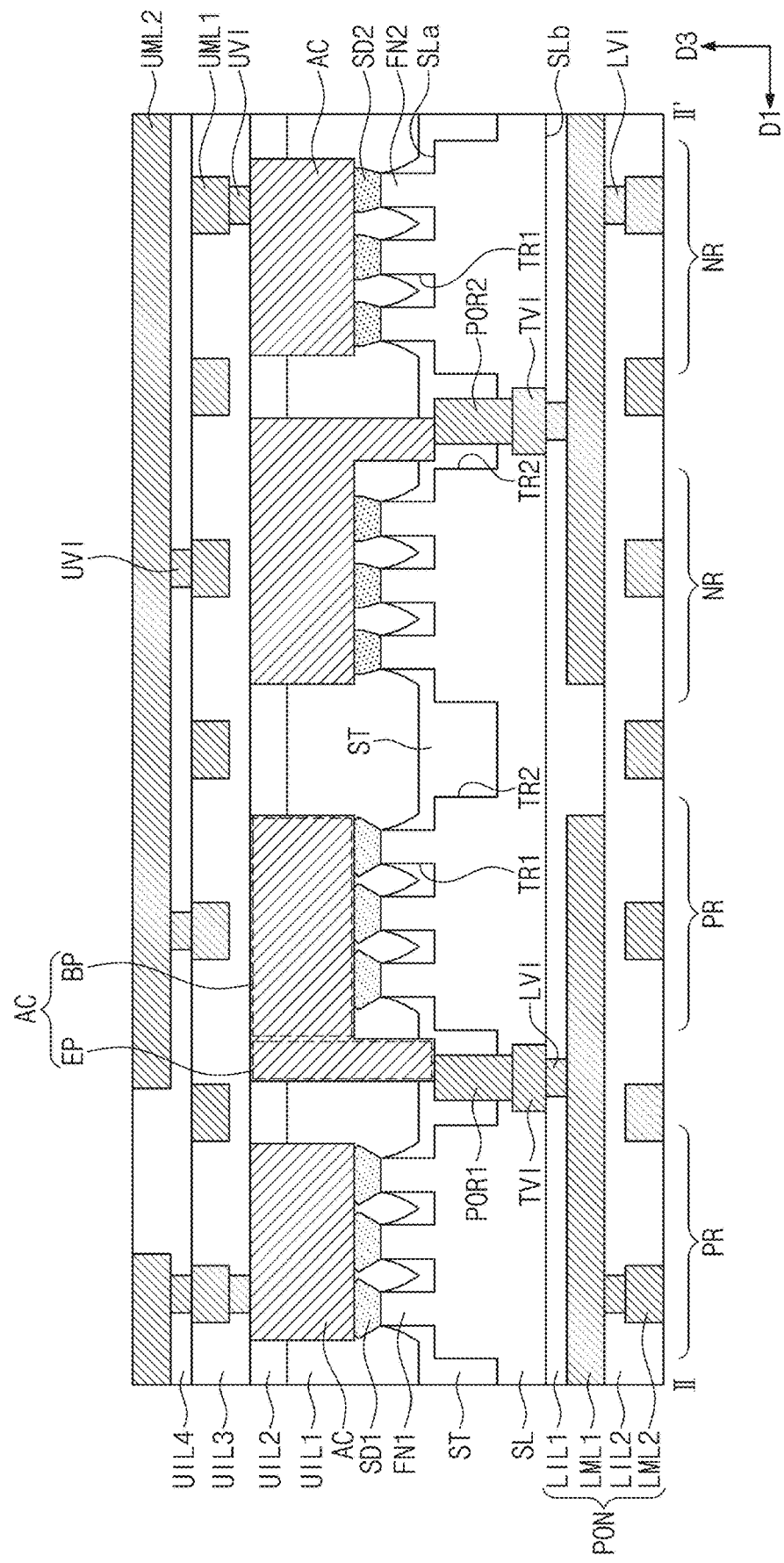
Figure 2C:
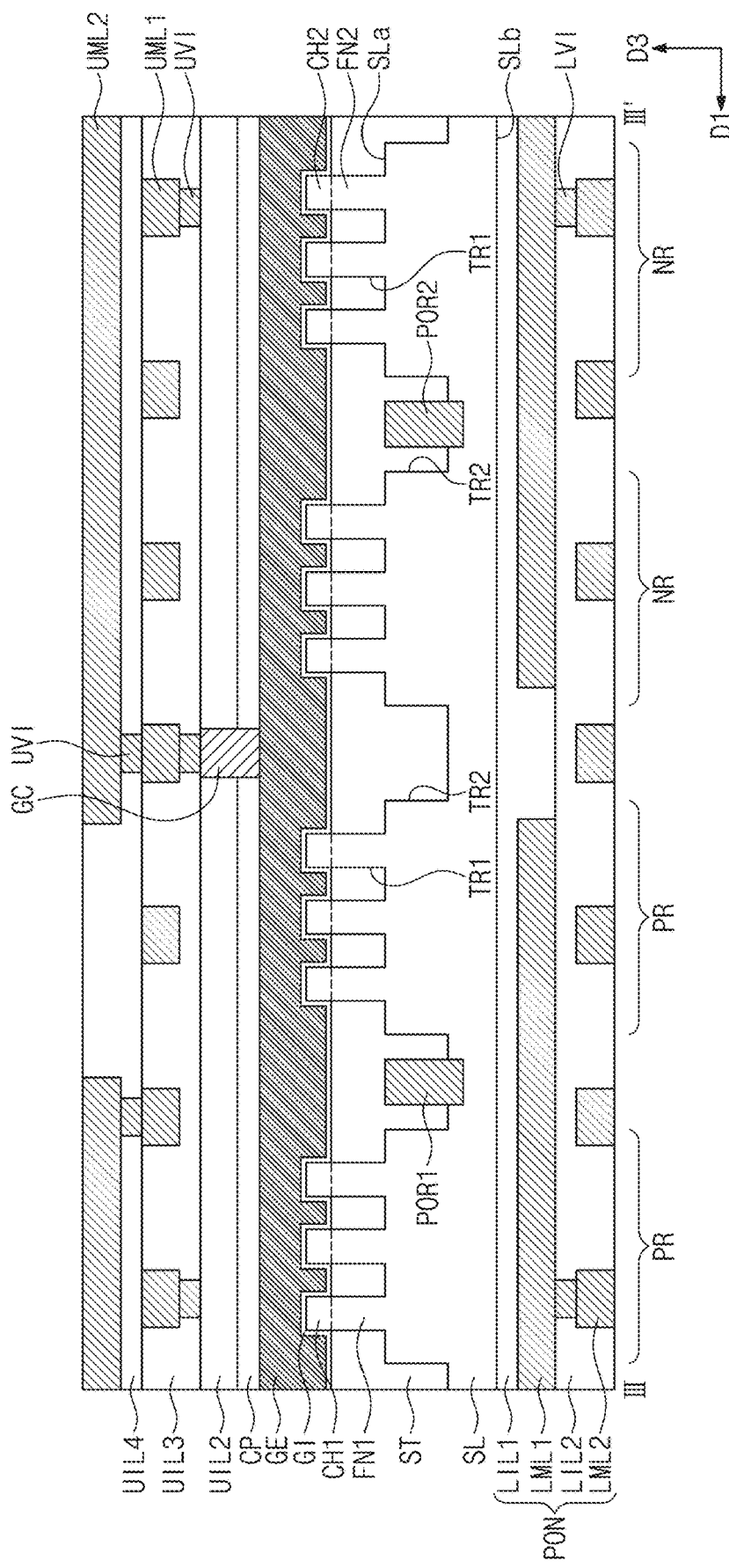
Figure 3:
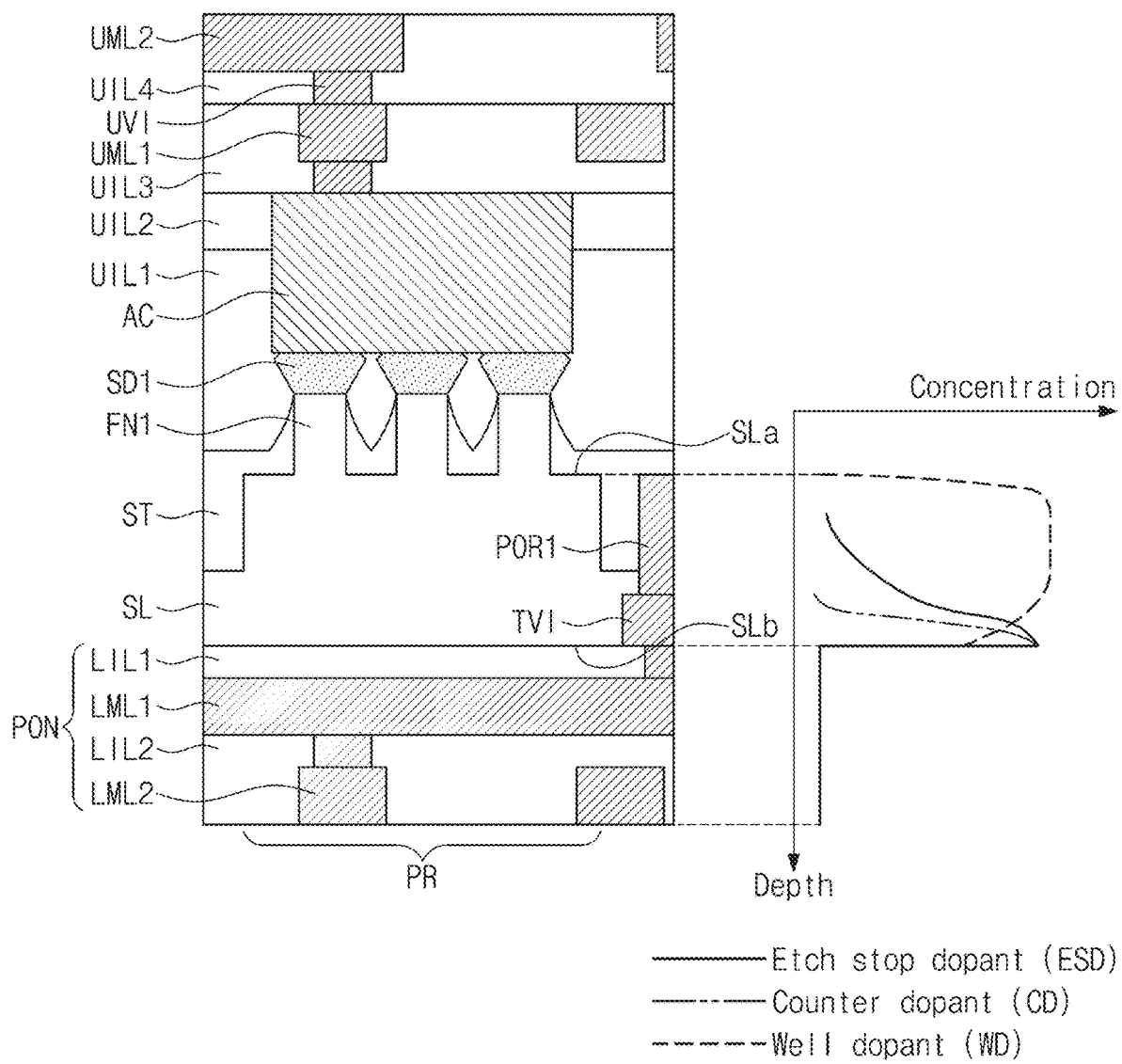
FIG. 3 is a graph schematically showing dopant concentrations according to a depth in a semiconductor layer of FIG. 2A.

FIG. 1 is a plan view illustrating a semiconductor device according to some example embodiments of the inventive concepts. FIGS. 2A, 2B and 2C are cross-sectional views taken along lines I-I', II-II' and III-III' of FIG. 1, respectively. FIG. 3 is a graph schematically showing dopant concentrations according to a depth in a semiconductor layer of FIG. 2A.

Referring to FIGS. 1 and 2A to 2C, a semiconductor layer SL may be provided. The semiconductor layer SL may have a first surface SLa and a second surface SLb opposite to the first surface SLa. The semiconductor layer SL may include first active regions PR and second active regions NR. For example, the semiconductor layer SL may include silicon, germanium, or a combination thereof.

A device isolation layer ST may be provided on the first surface SLa of the semiconductor layer SL. The device isolation layer ST may define the first active regions PR and/or the second active regions NR. For example, the first active region PR may be a PMOSFET region, and the second active region NR may be an NMOSFET region. Each of the first and second active regions PR and NR may be defined by a second trench TR2 formed in the first surface SLa of the semiconductor layer SL, and the device isolation layer ST may fill the second trench TR2. For example, the device isolation layer ST may include a silicon oxide layer.

The first and/or second active regions PR and NR may be arranged in a first direction D1. For example, the first active region PR and the second active region NR may be spaced apart from each other in the first direction D1 with the device isolation layer ST interposed therebetween.

A first power rail POR1 may be provided in the second trench TR2 between a pair of the first active regions PR adjacent to each other. A second power rail POR2 may be provided in the second trench TR2 between a pair of the second active regions NR adjacent to each other. The first and/or second power rails POR1 and POR2 may be buried in the device isolation layer ST. The first and/or second power rails POR1 and POR2 may have line shapes extending in a second direction D2.

Through-vias TVI extending from the second surface SLb toward the first surface SLa of the semiconductor layer SL may be provided. The through-vias TVI may partially penetrate the semiconductor layer SL. In other words, a top surface of the through-via TVI may be lower than the first surface SLa. A bottom surface of the through-via TVI may be coplanar with the second surface SLb. The through-vias TVI may be connected to the first and/or second power rails POR1 and POR2, respectively.

A plurality of first active patterns FN1 extending in the second direction D2 may be provided on each of the first active regions PR. A plurality of second active patterns FN2 extending in the second direction D2 may be provided on each of the second active regions NR. The first and/or second active patterns FN1 and FN2 may be portions of the semiconductor layer SL, which vertically protrude. The first and/or second active patterns FN1 and FN2 may vertically protrude from the first surface SLa. The first and/or second active patterns FN1 and FN2 may be arranged along the first direction D1.

For example, three first active patterns FN1 may extend in the second direction D2 in parallel to each other on the first active region PR. For example, three second active patterns FN2 may extend in the second direction D2 in parallel to each other on the second active region NR. However, the number and shapes of the first active patterns FN1 on the first active region PR and the number and shapes of the second active patterns FN2 on the second active region NR are illustrated as an example and are not limited to the illustration.

A first trench TR1 may be defined between a pair of the active patterns FN1 adjacent to each other in the first direction D1, and between a pair of the active patterns FN2 adjacent to each other in the first direction D1. The device isolation layer ST may also fill the first trenches TR1.

Upper portions of the first and/or second active patterns FN1 and FN2 may be higher than a top surface of the device isolation layer ST. The upper portions of the first and/or second active patterns FN1 and FN2 may vertically protrude from the device isolation layer ST. The upper portions of the first and/or second active patterns FN1 and FN2 may have fin-shapes protruding from the device isolation layer ST.

The upper portion of each of the first active patterns FN1 may include first channel regions CH1 and/or first source/drain regions SD1. The first source/drain regions SD1 may be P-type dopant regions. Each of the first channel regions CH1 may be disposed between a pair of the first source/drain regions SD1 adjacent to each other. The upper portion of each of the second active patterns FN2 may include second channel regions CH2 and/or second source/drain regions SD2. The second source/drain regions SD2 may be N-type dopant regions. Each of the second channel regions CH2 may be disposed between a pair of the second source/drain regions SD2 adjacent to each other.

The first and/or second source/drain regions SD1 and SD2 may include epitaxial patterns formed by a selective epitaxial growth (SEG) process. Top surfaces of the first and/or second source/drain regions SD1 and SD2 may be higher than top surfaces of the first and/or second channel regions CH1 and CH2.

In some example embodiments, the first source/drain regions SD1 may include a semiconductor element of which a lattice constant is greater than that of a semiconductor element of the semiconductor layer SL. Thus, the first source/drain regions SD1 may provide compressive stress to the first channel regions CH1. In some example embodiments, the second source/drain regions SD2 may include the same semiconductor element as the semiconductor layer SL. For example, the first source/drain regions SD1 may include silicon-germanium (SiGe), and/or the second source/drain regions SD2 may include silicon.

A cross-sectional shape of each of the first source/drain regions SD1 may be different from a cross-sectional shape of each of the second source/drain regions SD2 when viewed in a cross-sectional view taken along the first direction D1 (see FIG. 2B).

Gate electrodes GE may extend in the first direction D1 to intersect the first and/or second active patterns FN1 and FN2. The gate electrodes GE may be spaced apart from each other in the second direction D2. The gate electrodes GE may vertically overlap with the first and/or second channel regions CH1 and CH2. Each of the gate electrodes GE may be provided on a top surface and both sidewalls of each of the first and second channel regions CH1 and CH2 (see FIG. 2C). For example, the gate electrodes GE may include at least one of a conductive metal nitride (e.g., titanium nitride and/or tantalum nitride) and/or a metal material (e.g., titanium, tantalum, tungsten, copper, and/or aluminum).

A pair of gate spacers GS may be disposed on both sidewalls of each of the gate electrodes GE, respectively. The gate spacers GS may extend along the gate electrodes GE in the first direction D1. Top surfaces of the gate spacers GS may be higher than top surfaces of the gate electrodes GE. The top surfaces of the gate spacers GS may be coplanar with a top surface of a gate capping layer CP to be described later. For example, the gate spacers GS may include at least one of SiCN, SiCON, and/or SiN. In some example embodiments, each of the gate spacers GS may have a multi-layered structure formed of at least two of SiCN, SiCON, and/or SiN.

A gate dielectric layer GI may be disposed between each of the gate electrodes GE and the channel regions CH1 and CH2. The gate dielectric layer GI may extend along a bottom surface of the gate electrode GE. The gate dielectric layer GI may cover the top surface and the both sidewalls of each of the first and second channel regions CH1 and CH2. The gate dielectric layer GI may include a high-k dielectric material of which a dielectric constant is higher than that of silicon oxide. For example, the high-k dielectric material may include at least one of hafnium oxide, hafnium-silicon oxide, lanthanum oxide, zirconium oxide, zirconium-silicon oxide, tantalum oxide, titanium oxide, barium-strontium-titanium oxide, barium-titanium oxide, strontium-titanium oxide, lithium oxide, aluminum oxide, lead-scandium-tantalum oxide, and/or lead-zinc niobate.

A gate capping layer CP may be provided on each of the gate electrodes GE. The gate capping layer CP may extend along the gate electrode GE in the first direction D1. The gate capping layer CP may include a material having an etch selectivity with respect to first and second upper insulating layers UIL1 and UIL2 to be described later. For example, the gate capping layer CP may include at least one of SiON, SiCN, SiCON, and/or SiN.

A first upper insulating layer UIL1, a second upper insulating layer UIL2, a third upper insulating layer UIL3 and/or a fourth upper insulating layer UIL4 may be sequentially stacked on the first surface SLa of the semiconductor layer SL. Each of the first to fourth upper insulating layers UIL1 to UIL4 may include a silicon oxide layer and/or a silicon oxynitride layer. The first upper insulating layer UIL1 may cover the first and/or second active patterns FN1 and FN2.

Active contacts AC may penetrate the first and second upper insulating layers UIL1 and UIL2 between a pair of the gate electrodes GE so as to be electrically connected to the first and/or second source/drain regions SD1 and SD2. The active contacts AC may have bar shapes extending in the first direction D1. For example, the active contact AC may be connected to a plurality of the first source/drain regions SD1 and/or a plurality of the second source/drain regions SD2.

At least one active contact AC may be electrically connected to the first power rail POR1 and/or the second power rail POR2. The at least one active contact AC may include a body portion BP and/or an extension EP.

The body portion BP may be provided on the first source/drain regions SD1 and/or the second source/drain regions SD2 and may be electrically connected to the first source/drain regions SD1 and/or the second source/drain regions SD2. At least a portion of the extension EP may vertically overlap with the first power rail POR1 and/or the second power rail POR2. The extension EP may vertically extend from the body portion BP to the first power rail POR1 and/or the second power rail POR2. Thus, the extension EP may be in contact with the first power rail POR1 and/or the second power rail POR2. A lower portion of the extension EP may penetrate an upper portion of the device isolation layer ST so as to be connected to the first power rail POR1 and/or the second power rail POR2.

A power voltage (VDD) and/or a ground voltage (VSS) may be applied to the first and/or second power rails POR1 and POR2, respectively. The power voltage (VDD) may be applied to the first source/drain regions SD1 through the extension EP and/or the body portion BP of the active contact AC. The ground voltage (VSS) may be applied to the second source/drain regions SD2 through the extension EP and/or the body portion BP of the active contact AC.

A gate contact GC may be provided on at least one gate electrode GE. The gate contact GC may penetrate the second upper insulating layer UIL2 and/or the gate capping layer CP so as to be electrically connected to the gate electrode GE. The gate contact GC may be disposed between the first active region PR and the second active region NR when viewed in a plan view. The gate contact GC may vertically overlap with the device isolation layer ST filling the second trench TR2 between the first active region PR and the second active region NR.

The active contacts AC and the gate contact GC may include the same conductive material. The active contacts AC and the gate contact GC may include a metal material, for example, at least one of aluminum, copper, tungsten, molybdenum, and/or cobalt.

The first and/or second active patterns FN1 and FN2, the first and/or second channels CH1 and CH2, the first and/or second source/drain regions SD1 and SD2, the gate electrodes GE, the gate contact GC, and/or the active contacts AC may collectively be referred to as a transistor.

First upper interconnection lines UML1 may be provided in the third upper insulating layer UIL3, and/or second upper interconnection lines UML2 may be provided in the fourth upper insulating layer UIL4. An upper via UVI may be provided under each of the first and/or second upper interconnection lines UML1 and UML2.

For example, the first upper interconnection lines UML1 and/or the upper vias UVI connected thereto may constitute a first metal layer. The second upper interconnection lines UML2 and/or the upper vias UVI connected thereto may constitute a second metal layer. Even though not shown in the drawings, a plurality of metal layers may be additionally stacked on the second metal layer.

A power delivery network PON may be provided on the second surface SLb of the semiconductor layer SL. The power delivery network PON may include a first lower insulating layer LIL1 and/or a second lower insulating layer LIL2 which are sequentially stacked on the second surface SLb of the semiconductor layer SL.

The power delivery network PON may further include first lower interconnection lines LML1 and/or second lower interconnection lines LML2. The first lower interconnection lines LML1 may be provided in the first lower insulating layer LIL1, and/or the second lower interconnection lines LML2 may be provided in the second lower insulating layer LIL2. A lower via LVI may be provided on each of the first and second lower interconnection lines LML1 and LML2.

At least one of the first lower interconnection lines LML1 may be electrically connected to the through-via TVI through the lower via LVI. In other words, the first and/or second power rails POR1 and POR2 may be electrically connected to the first lower interconnection lines LML1. The first and/or second lower interconnection lines LML1 and LML2 may constitute an interconnection network for applying the power voltage (VDD) and/or the ground voltage (VSS) to the first and/or second power rails POR1 and POR2, respectively. Even though not shown in the drawings, a plurality of interconnection layers may be additionally provided on the first and/or second lower interconnection lines LML1 and LML2.

Concentration profiles of dopants according to a depth in the semiconductor layer SL will be described in detail with reference to FIG. 3. The semiconductor layer SL may include various dopants. In some example embodiments, the semiconductor layer SL may include a well dopant WD, an etch stop dopant ESD, and/or a counter dopant CD.

The well dopant WD may be a dopant for forming a well in the semiconductor layer SL. The well dopant WD may include phosphorus (P), arsenic (As), or a combination thereof. A concentration of the well dopant WD may increase and then decrease from the first surface SLa to the second surface SLb of the semiconductor layer SL. In other words, the well dopant WD may have the highest concentration at an intermediate point of the semiconductor layer SL. A concentration of the well dopant WD may be drastically reduced in the first lower insulating layer LIL1 such that the well dopant WD is not detected in the first lower insulating layer LIL1. In other words, the well dopant WD may not exist in the first lower insulating layer LIL1. The maximum concentration of the well dopant WD may range from $1E18/cm^3$ to $1E19/cm^3$, or from about $1E18/cm^3$ to about $1E19/cm^3$. As used herein, the term "about" means plus or minus 10% of a value.

The etch stop dopant ESD may be a dopant for forming an etch stop region used in a process of manufacturing the semiconductor layer SL according to some example embodiments. The etch stop dopant ESD may include boron (B), carbon (C), or a combination thereof. A concentration of the etch stop dopant ESD may increase from the first surface SLa to the second surface SLb. The etch stop dopant ESD may have the highest concentration (e.g., the maximum concentration) at the second surface SLb. A concentration of the etch stop dopant ESD may be drastically reduced in the first lower insulating layer LIL1 such that the etch stop dopant ESD is not detected in the first lower insulating layer LIL1. In other words, the etch stop dopant ESD may not exist in the first lower insulating layer LIL1. The maximum concentration of the etch stop dopant ESD may range from $1E16/cm^3$ to $5E21/cm^3$, or from about $1E16/cm^3$ to about $5E21/cm^3$. In particular, the maximum concentration of the etch stop dopant ESD may range from $1E18/cm^3$ to $5E20/cm^3$, or from about $1E18/cm^3$ to about $5E20/cm^3$.

The counter dopant CD may be a dopant for reducing or preventing the etch stop dopant ESD from permeating into the well of the semiconductor layer SL. The counter dopant CD may include phosphorus (P), arsenic (As), or a combination thereof. A concentration of the counter dopant CD may increase from the first surface SLa to the second surface SLb. The counter dopant CD may have the highest concentration (e.g., the maximum concentration) at the second surface SLb. A concentration of the counter dopant CD may be drastically reduced in the first lower insulating layer LIL1 such that the counter dopant CD is not detected in the first lower insulating layer LIL1. In other words, the counter dopant CD may not exist in the first lower insulating layer LIL1. The maximum concentration of the counter dopant CD may range from $1E18/cm^3$ to $5E20/cm^3$, or from about $1E18/cm^3$ to about $5E20/cm^3$. In some example embodiments, the counter dopant CD may be omitted.

In the semiconductor device according to some example embodiments of the inventive concepts, the power delivery network PON may be stably formed on the second surface SLb of the semiconductor layer SL by using the etch stop dopant ESD. In detail, the etch stop dopant ESD may reduce, inhibit, or prevent the semiconductor layer SL from being etched in a process of forming the power delivery network PON. Thus, the power delivery network PON may be formed without damage of the first and/or second active regions PR and NR. As a result, reliability and integration density of the semiconductor device may be improved.

FIGS. 4A to 4J are cross-sectional views taken along the line II-II' of FIG. 1 to illustrate a method of manufacturing a semiconductor device, according to some example embodiments of the inventive concepts. FIG. 5 is a graph schematically showing dopant concentrations according to a depth in a semiconductor layer of FIG. 4C.

Referring to FIGS. 1 and 4A, a substrate SUB may be provided. The substrate SUB may be a silicon substrate. A first ion implantation process IIP1 may be performed on an upper portion of the substrate SUB to form an etch stop region ESR. The formation of the etch stop region ESR may include doping the upper portion of the substrate SUB with an etch stop dopant ESD, and performing a first annealing process.

The etch stop region ESR may include the etch stop dopant ESD. The etch stop dopant ESD may include boron (B), carbon (C), or a combination thereof. For example, the formation of the etch stop region ESR may include ion-implanting boron (B) with an energy of 10 KeV at a dose of $2E15/cm^2$.

Figure 4B:
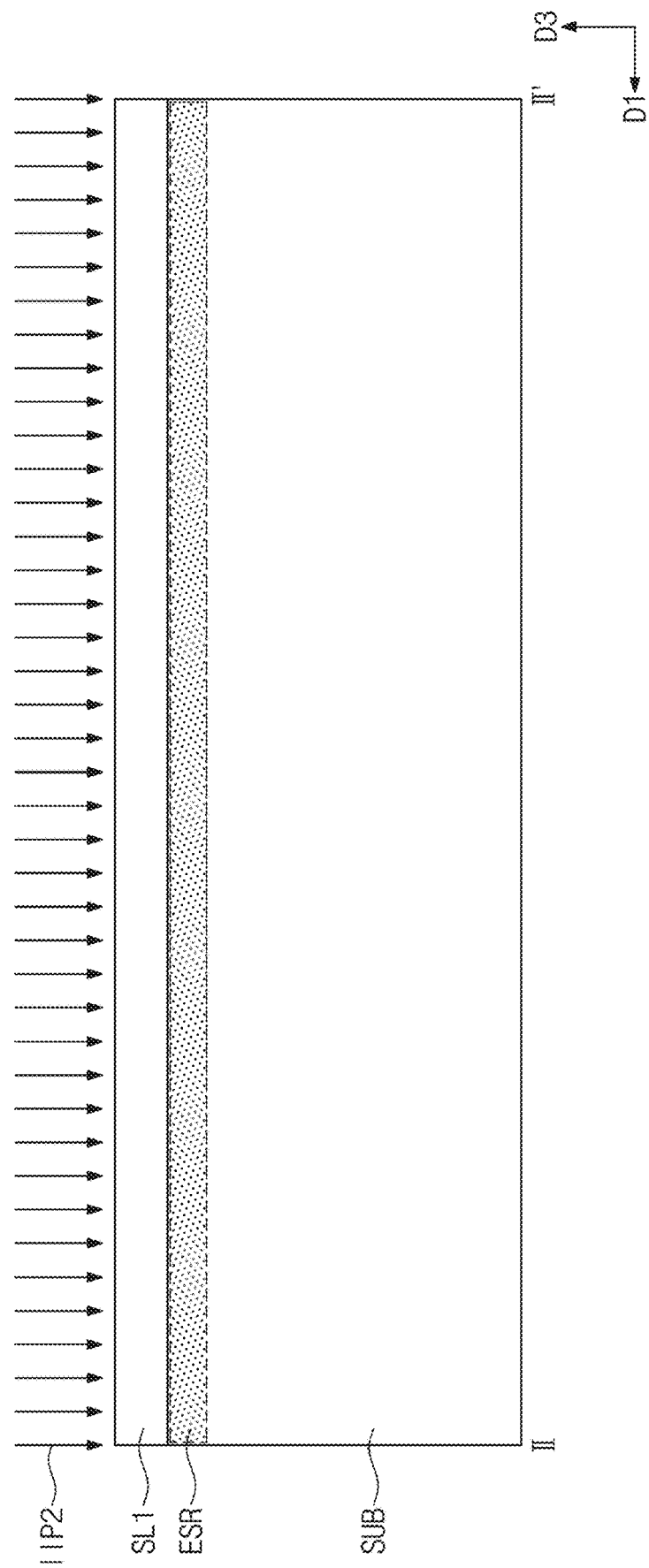
Figure 5:
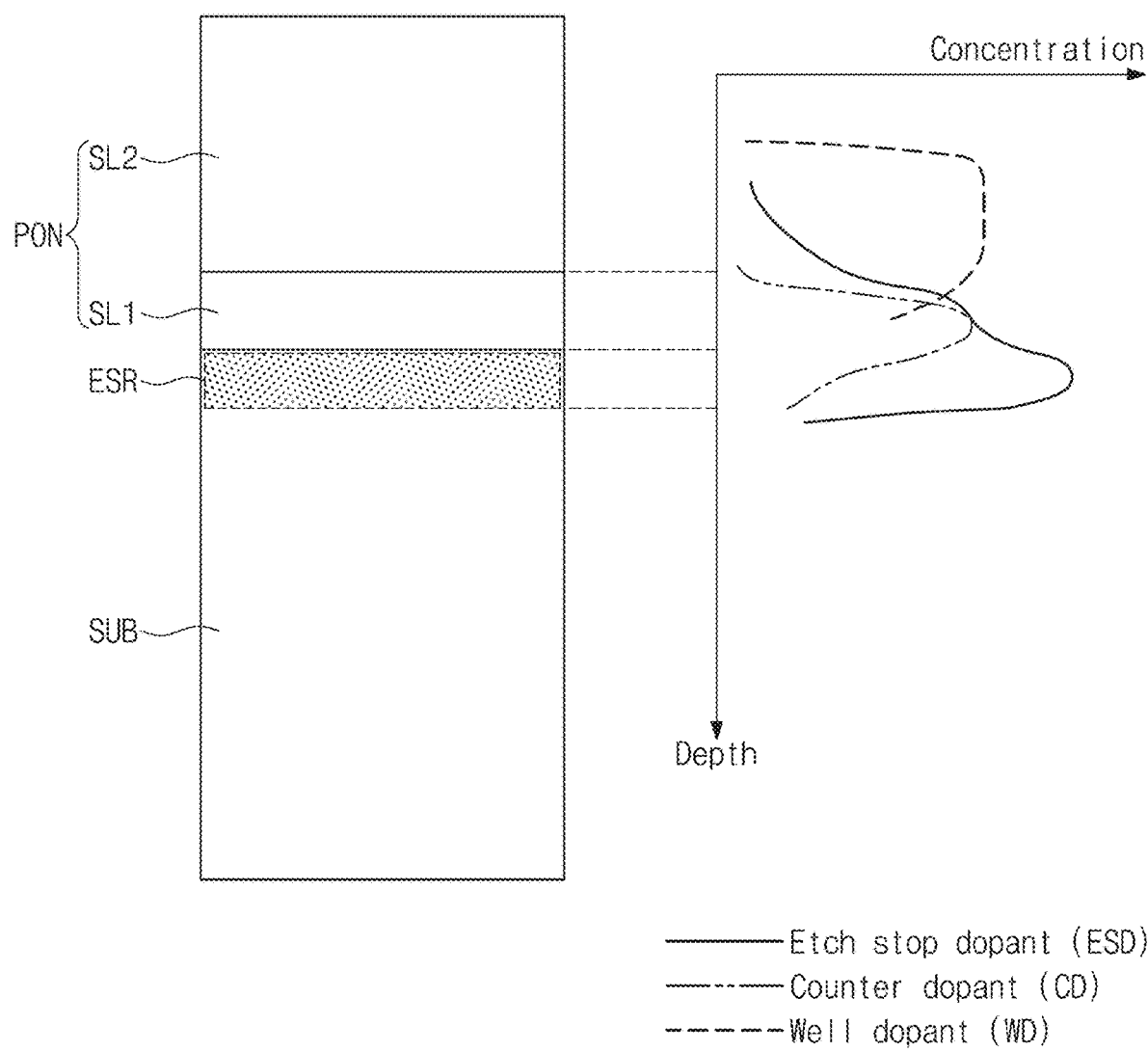
FIG. 5 is a graph schematically showing dopant concentrations according to a depth in a semiconductor layer of FIG. 4C.

Referring to FIGS. 1 and 4B, a first semiconductor layer SL1 may be formed on the etch stop region ESR of the substrate SUB. The formation of the first semiconductor layer SL1 may include performing a selective epitaxial growth (SEG) process on the substrate SUB. For example, the first semiconductor layer SL1 may include silicon.

A second ion implantation process IIP2 may be performed on the first semiconductor layer SL1. Subsequently, a second annealing process may be performed. A counter dopant CD may be implanted into the first semiconductor layer SL1 through the second ion implantation process IIP2. The counter dopant CD may reduce, inhibit, or prevent the etch stop dopant ESD from being diffused into a well of a second semiconductor layer SL2 to be described later.

The counter dopant CD may include phosphorus (P), arsenic (As), or a combination thereof. For example, in the second ion implantation process IIP2, arsenic (As) may be ion-implanted with an energy of 100 KeV at a dose of $1E13/cm^2$. For another example, in the second ion implantation process IIP2, phosphorus (P) may be ion-implanted with an energy of 400 KeV at a dose of $3E13/cm^2$.

Figure 4C:
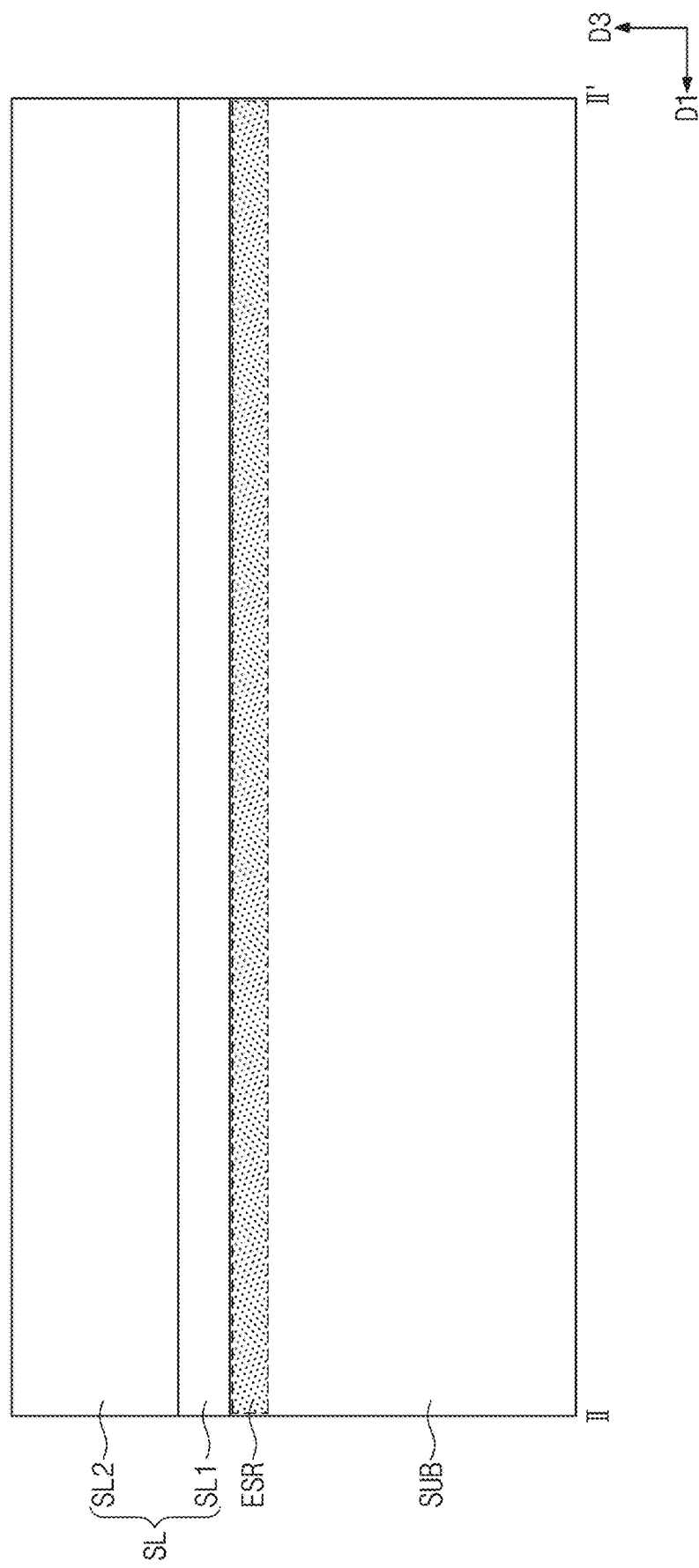

Referring to FIGS. 1 and 4C, a second semiconductor layer SL2 may be formed on the first semiconductor layer SL1. The formation of the second semiconductor layer SL2 may include performing a selective epitaxial growth (SEG) process on the first semiconductor layer SL1. For example, the second semiconductor layer SL2 may include silicon. A well may be formed in the second semiconductor layer SL2 by doping the second semiconductor layer SL2 with a well dopant WD. The first and/or second semiconductor layers SL1 and SL2 may constitute a semiconductor layer SL.

Referring to FIG. 5, the well dopant WD may have the maximum concentration in the second semiconductor layer SL2. In other words, the well dopant WD may form the well in the second semiconductor layer SL2. The counter dopant CD may have the maximum concentration in the first semiconductor layer SL1. The etch stop dopant ESD may have the maximum concentration in the etch stop region ESR. The maximum concentration of the etch stop dopant ESD may range from $1E19/cm^3$ to $5E21/cm^3$, or from about $1E19/cm^3$ to about $5E21/cm^3$. The maximum concentration of the counter dopant CD may range from $1E18/cm^3$ to $5E20/cm^3$, or from about $1E18/cm^3$ to about $5E20/cm^3$. The maximum concentration of the counter dopant CD may be less than the maximum concentration of the etch stop dopant ESD.

Figure 4D:
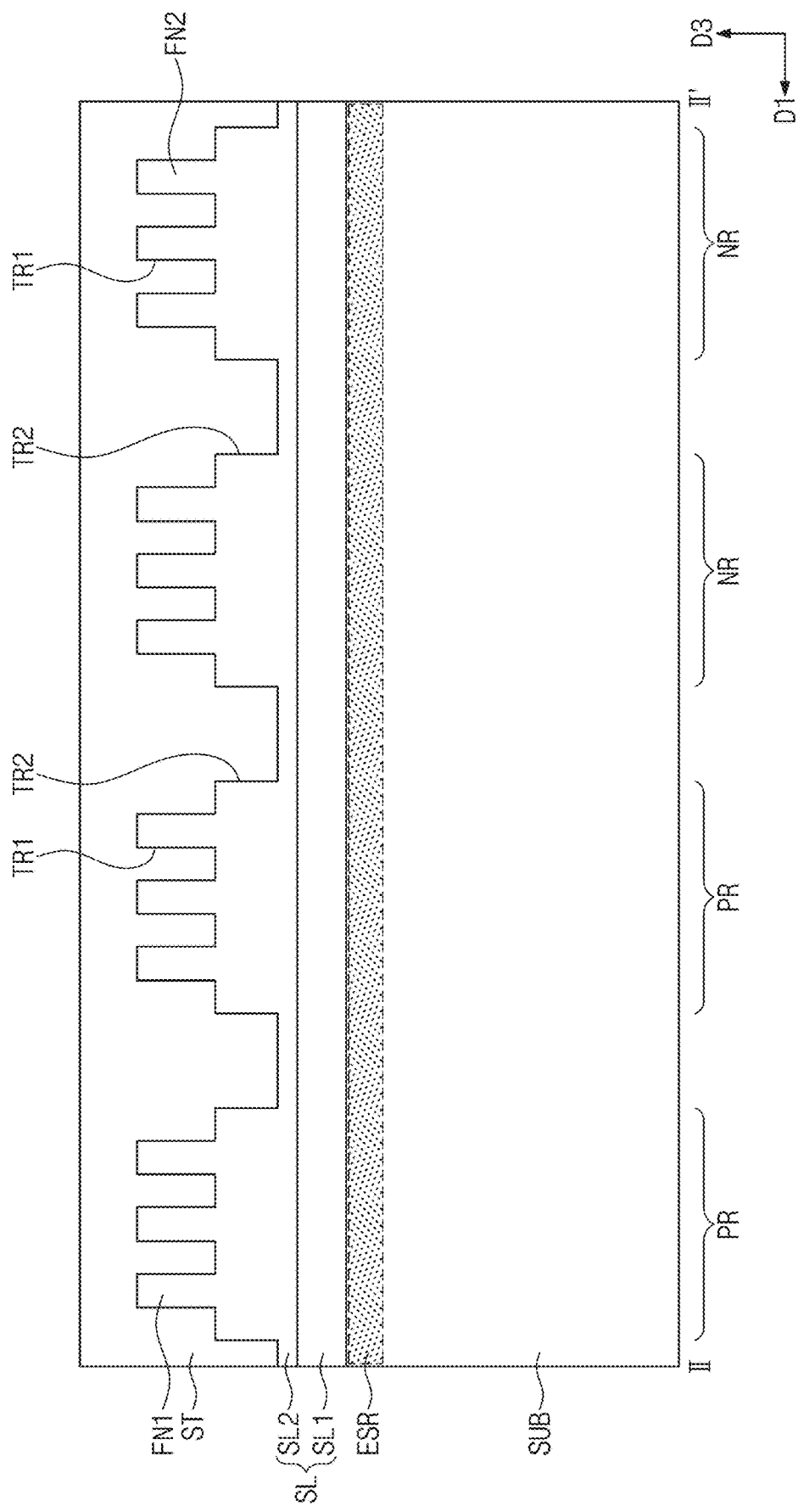

Referring to FIGS. 1 and 4D, an upper portion of the second semiconductor layer SL2 may be patterned to form first trenches TR1 extending in the second direction D2. The first trenches TR1 may define first and/or second active patterns FN1 and FN2 in the upper portion of the second semiconductor layer SL2. The first and/or second active patterns FN1 and FN2 may be arranged along the first direction D1.

The upper portion of the second semiconductor layer SL2 may be patterned to form a second trench TR2 defining first active regions PR and second active regions NR. While the second trench TR2 is formed, the active patterns FN1 and/or FN2 in a region where the second trench TR2 is formed may be removed. The second trench TR2 may be deeper than the first trench TR1.

A device isolation layer ST may be formed to fill the first and/or second trenches TR1 and TR2. The device isolation layer ST may be formed using silicon oxide.

Figure 4E:
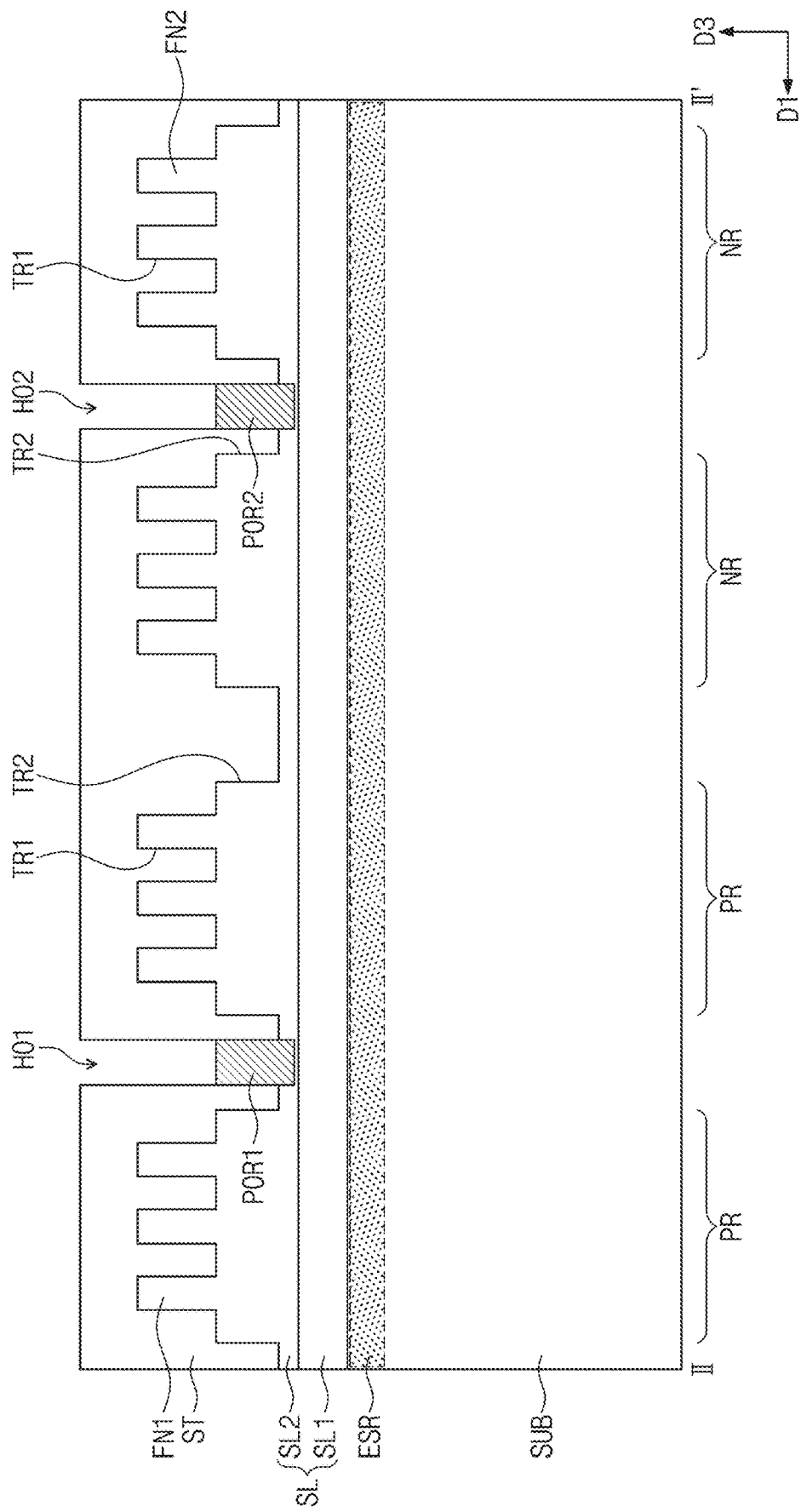

Referring to FIGS. 1 and 4E, the device isolation layer ST may be patterned to form a first hole HO1 between a pair of the first active regions PR adjacent to each other. The device isolation layer ST may be patterned to form a second hole HO2 between a pair of the second active regions NR adjacent to each other. The first and/or second holes HO1 and HO2 may be formed at the same time by using the same photolithography process.

Each of the first and/or second holes HO1 and HO2 may expose a bottom surface of the second trench TR2. When the first and/or second holes HO1 and HO2 are formed, the exposed bottom surfaces of the second trench TR2 may be recessed by over-etching. The first and/or second holes HO1 and HO2 may extend in parallel to each other in the second direction D2.

A first power rail POR1 and/or a second power rail POR2 may be formed in the first hole HO1 and/or the second hole HO2, respectively. The formation of the first and/or second power rails POR1 and POR2 may include forming a conductive layer filling the first and/or second holes HO1 and HO2, and recessing the conductive layer.

Figure 4F:
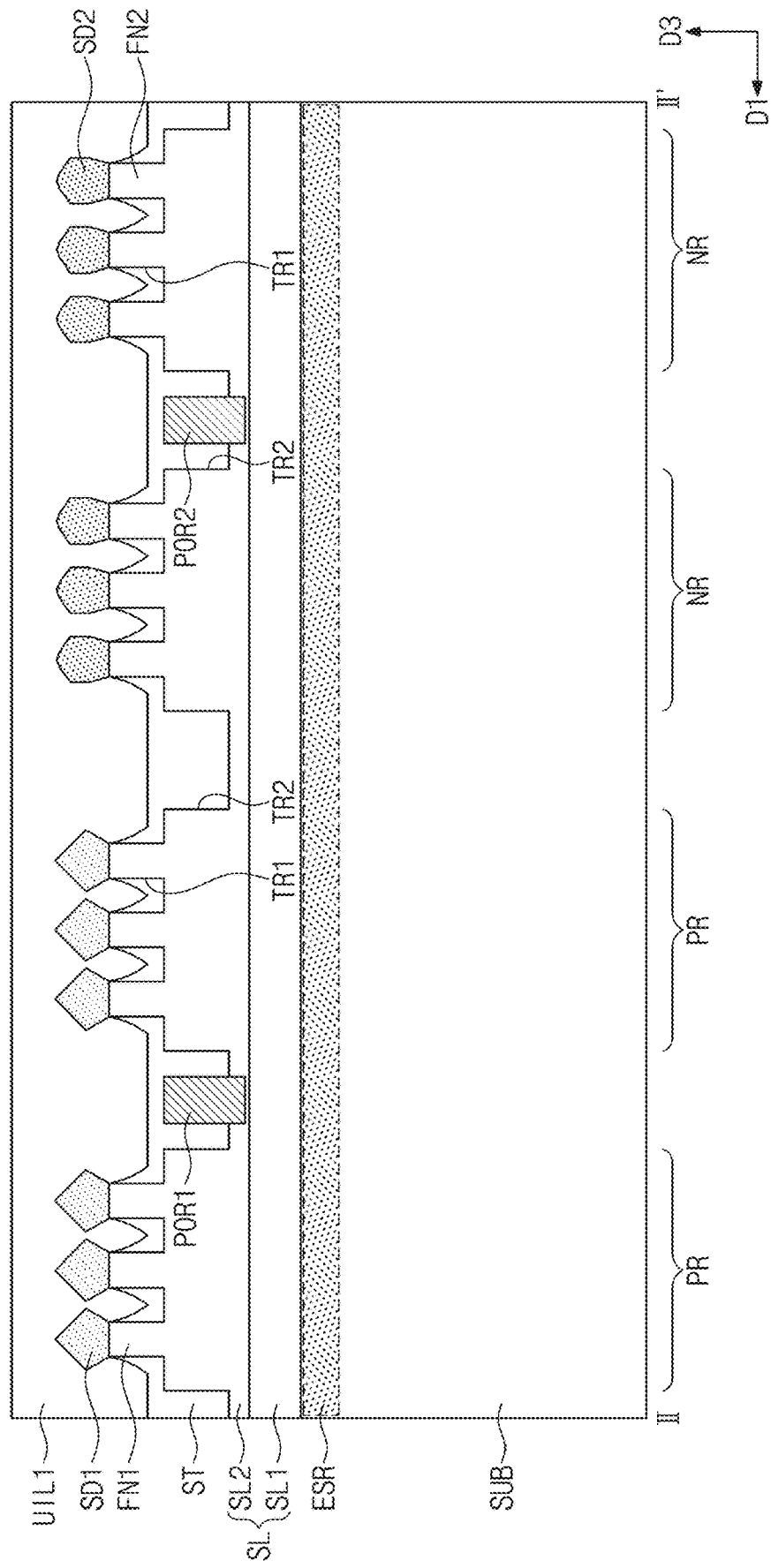

Referring to FIGS. 1 and 4F, an insulating layer may be deposited on the device isolation layer ST to completely fill the first and/or second holes HO1 and HO2. The insulating layer and/or the device isolation layer ST may be recessed until upper portions of the first and second active patterns FN1 and FN2 are exposed.

First source/drain regions SD1 may be formed in upper portions of the first active patterns FN1. Second source/drain regions SD2 may be formed in upper portions of the second active patterns FN2. The first source/drain regions SD1 may be doped with P-type dopants, and the second source/drain regions SD2 may be doped with N-type dopants.

The first and/or second source/drain regions SD1 and SD2 may include epitaxial patterns formed by a selective epitaxial growth (SEG) process. In detail, portions of the first and/or second active patterns FN1 and FN2 may be recessed, and then, the SEG process may be performed on the recessed regions of the first and/or second active patterns FN1 and FN2 to form the epitaxial patterns. A first upper insulating layer UIL1 may be formed to cover the first and/or second source/drain regions SD1 and SD2.

Referring to FIGS. 1, 2A and 2C, gate electrodes GE extending in the first direction D1 may be formed to intersect the first and/or second active patterns FN1 and FN2. Gate dielectric layers GI may be formed under the gate electrodes GE, respectively. Gate spacers GS may be formed on both sidewalls of each of the gate electrodes GE. Gate capping layers CP may be formed on the gate electrodes GE, respectively.

Figure 4G:
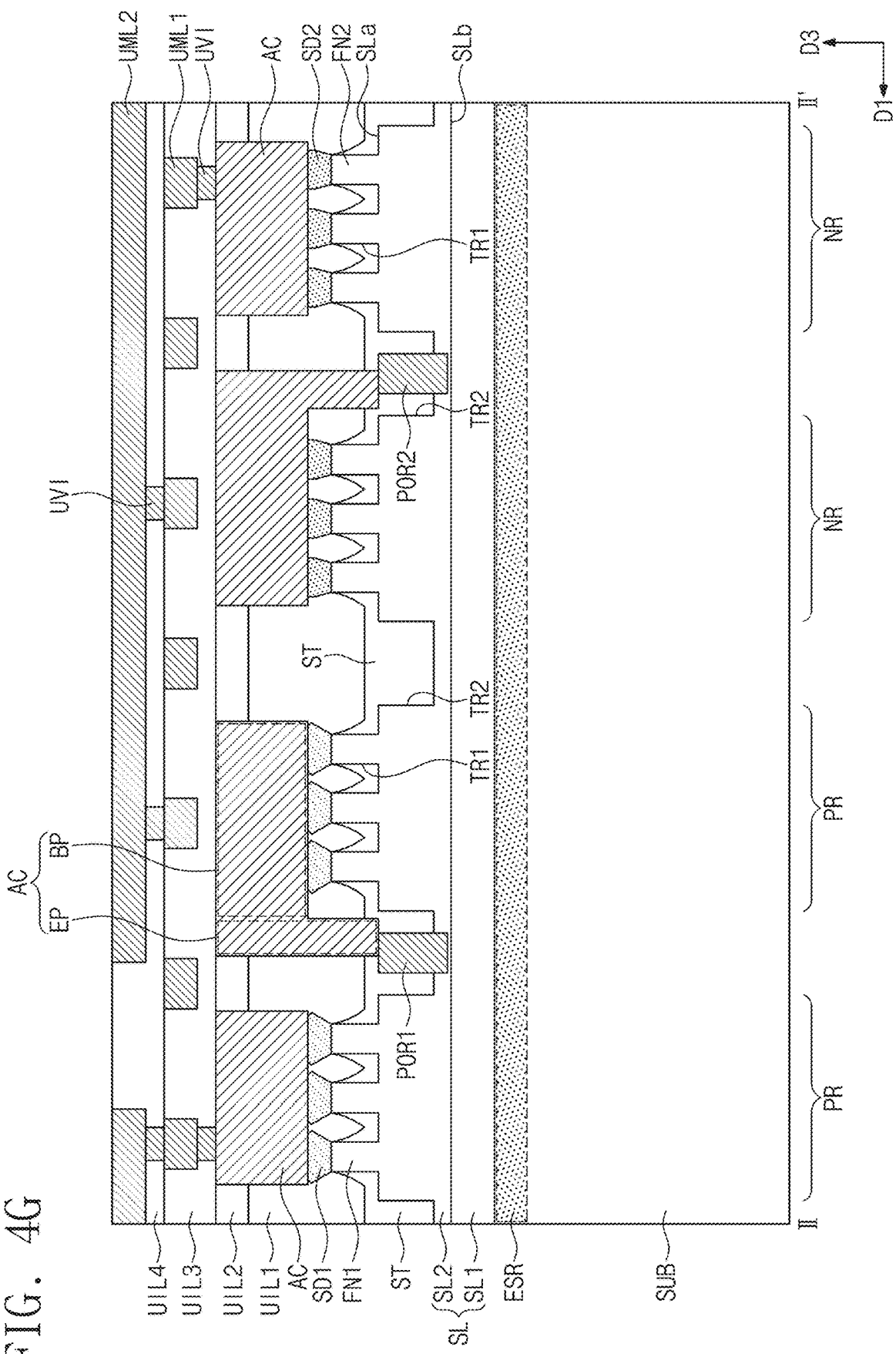

Referring to FIGS. 1 and 4G, a second upper insulating layer UIL2 may be formed on the first upper insulating layer UIL1. Active contacts AC may be formed to penetrate the first and/or second upper insulating layers UIL1 and UIL2. The active contacts AC may be formed on the first and/or second source/drain regions SD1 and SD2.

At least one active contact AC may be formed to be electrically connected to the first power rail POR1 and/or the second power rail POR2. For example, the formation of the at least one active contact AC may include forming a first contact hole exposing the first power rail POR1 and/or the second power rail POR2, forming a second contact hole exposing the first source/drain regions SD1 and/or the second source/drain regions SD2, and forming an extension EP and/or a body portion BP in the first contact hole and/or the second contact hole, respectively.

A third upper insulating layer UIL3 and/or a fourth upper insulating layer UIL4 may be formed on the second upper insulating layer UIL2. First upper interconnection lines UML1 may be formed in the third upper insulating layer UIL3, and/or second upper interconnection lines UML2 may be formed in the fourth upper insulating layer UIL4. Even though not shown in the drawings, a plurality of metal layers stacked on the fourth upper insulating layer UIL4 may be additionally formed.

Figure 4H:
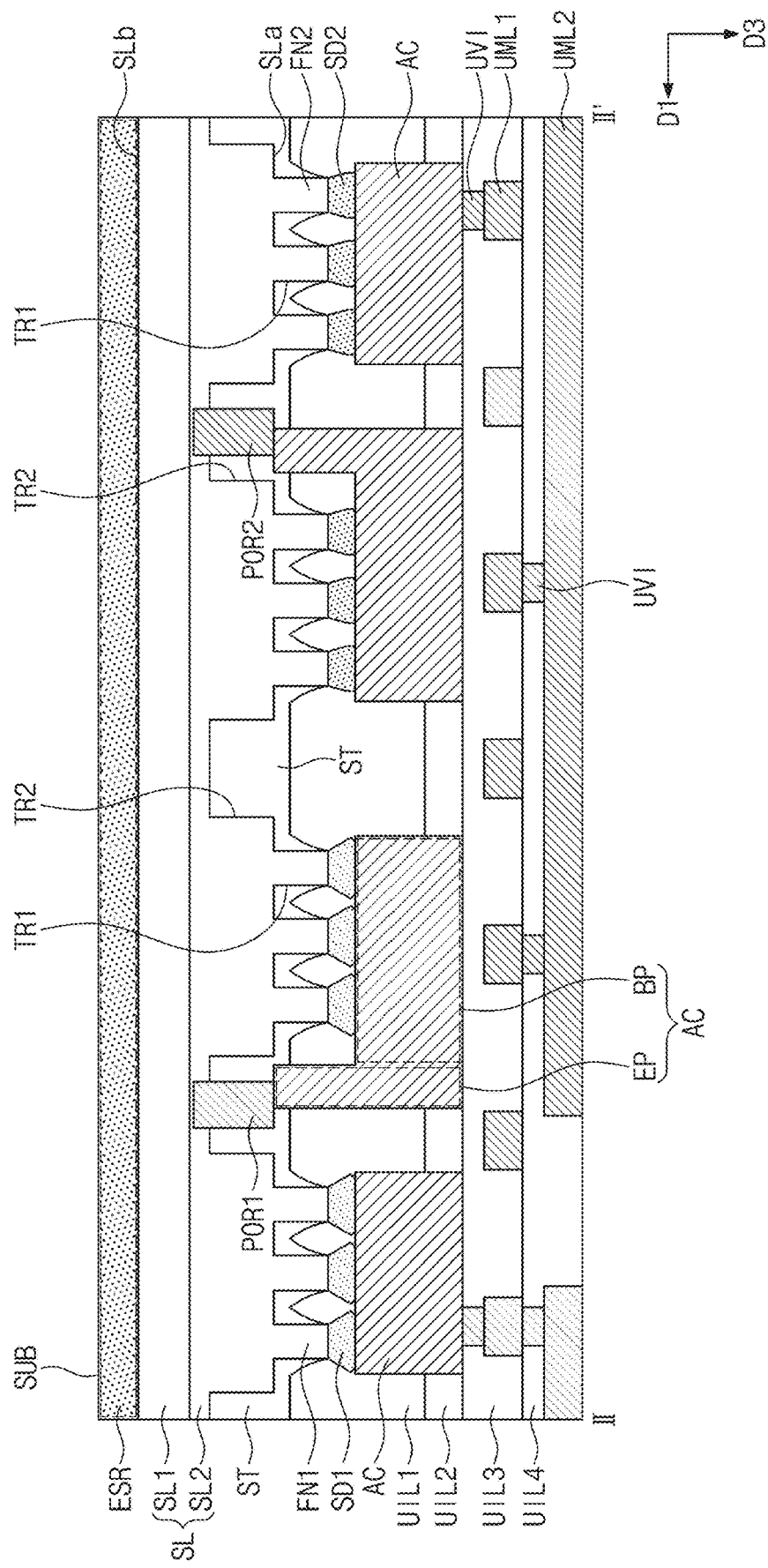

Referring to FIGS. 1 and 4H, the substrate SUB may be flipped in such a way that a bottom surface of the substrate SUB is exposed. In other words, the substrate SUB may be flipped in such a way that a second surface SLb of the semiconductor layer SL faces upward.

A wet etching process may be performed on the substrate SUB to etch the substrate SUB. The wet etching process may be performed until the etch stop region ESR of the substrate SUB is exposed. In detail, the etch stop region ESR may have an etch selectivity with respect to the substrate SUB formed of silicon. Thus, in the wet etching process, the substrate SUB formed of silicon may be selectively etched, but the etch stop region ESR including the etch stop dopant ESD may not be etched but may remain.

In the method of manufacturing the semiconductor device according to some example embodiments of the inventive concepts, the wet etching process may be easily controlled by the etch stop region ESR. In other words, etching dispersion of the substrate SUB may be reduced. Thus, it is possible to reduce or prevent a process defect (damage) of the first and second active regions PR and NR, and a power delivery network PON to be described later may be stably formed on the second surface SLb of the semiconductor layer SL.

Figure 4I:
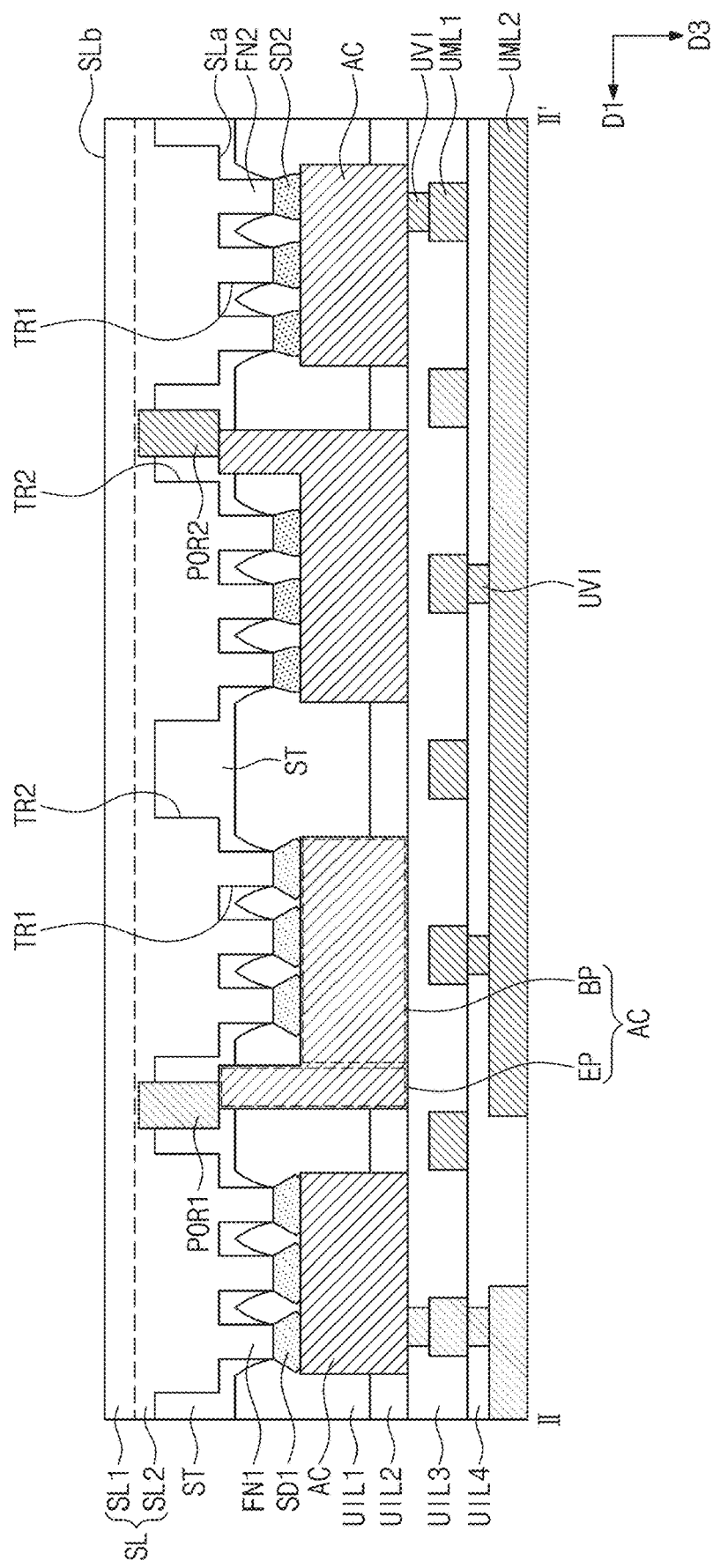

Referring to FIGS. 1 and 4I, a planarization process may be performed on the etch stop region ESR until the second surface SLb of the semiconductor layer SL is exposed. The etch stop region ESR may be removed by the planarization process. A portion of the first semiconductor layer SL1 may also be removed by the planarization process.

Figure 4J:
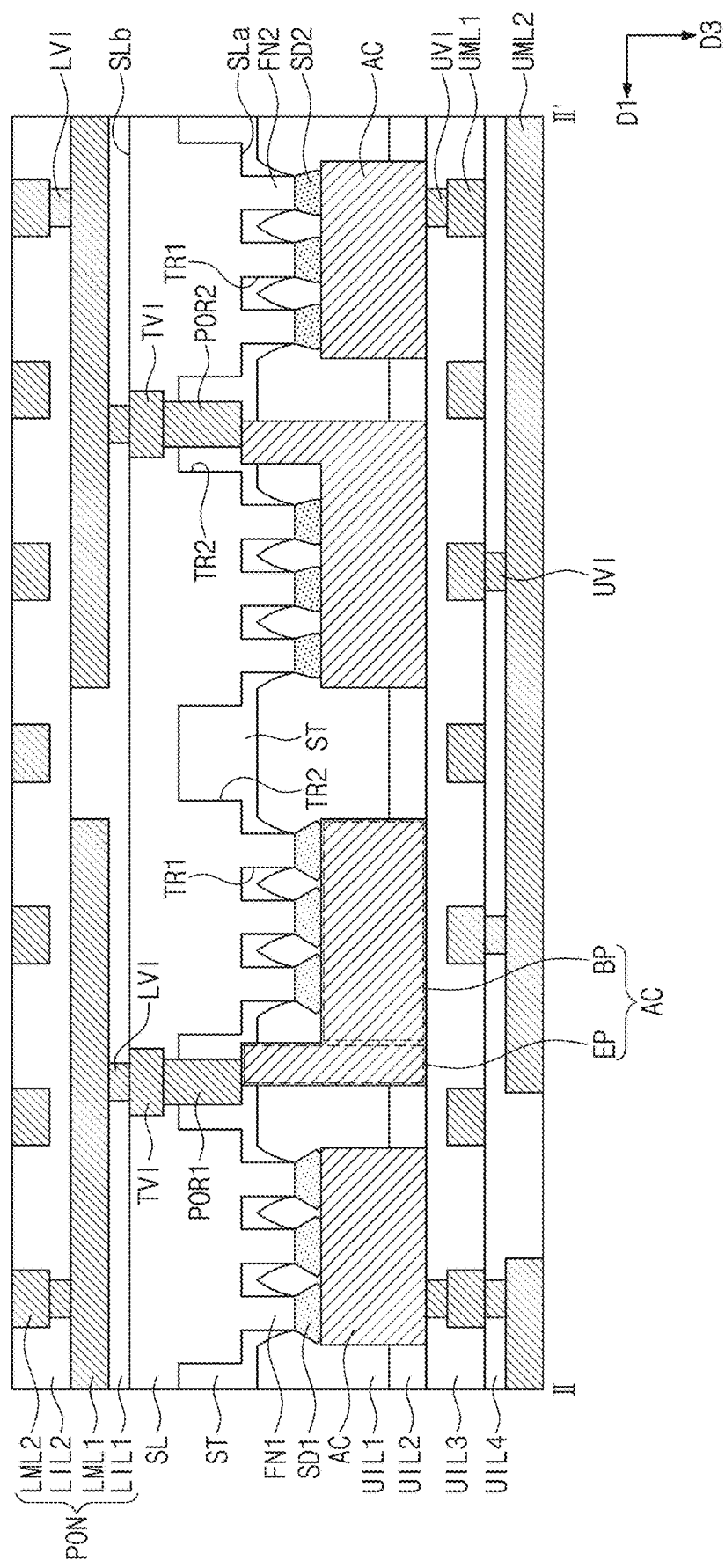

Referring to FIGS. 1 and 4J, through-vias TVI extending from the second surface SLb toward the first surface SLa of the semiconductor layer SL may be formed. For example, the formation of the through-vias TVI may include performing an etching process on the second surface SLb of the semiconductor layer SL to form through-holes exposing the first and/or second power rails POR1 and POR2, and forming the through-vias TVI in the through-holes, respectively.

A first lower insulating layer LIL1 and/or a second lower insulating layer LIL2 may be formed on the second surface SLb of the semiconductor layer SL. First lower interconnection lines LML1 may be formed in the first lower insulating layer LIL1, and/or second lower interconnection lines LML2 may be formed in the second lower insulating layer LIL2.

The first lower interconnection lines LML1 and/or the second lower interconnection lines LML2 may constitute a power delivery network PON. The power delivery network PON may be electrically connected to the first and/or second power rails POR1 and POR2 through the through-vias TVI. The power delivery network PON may apply a power voltage (VDD) and/or a ground voltage (VSS) to the first and/or second power rails POR1 and POR2, respectively.

Figure 6:
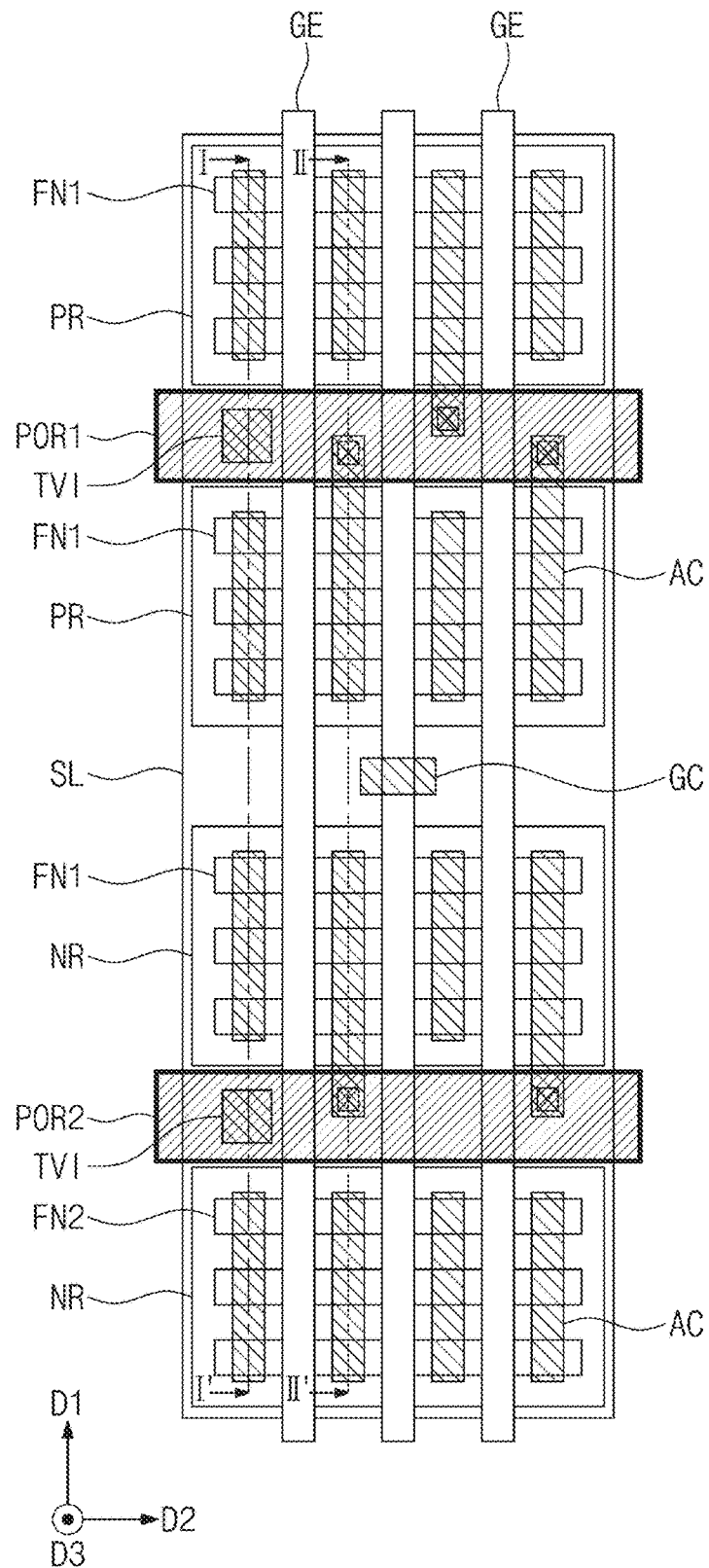
FIG. 6 is a plan view illustrating a semiconductor device according to some example embodiments of the inventive concepts.
Figure 7A:
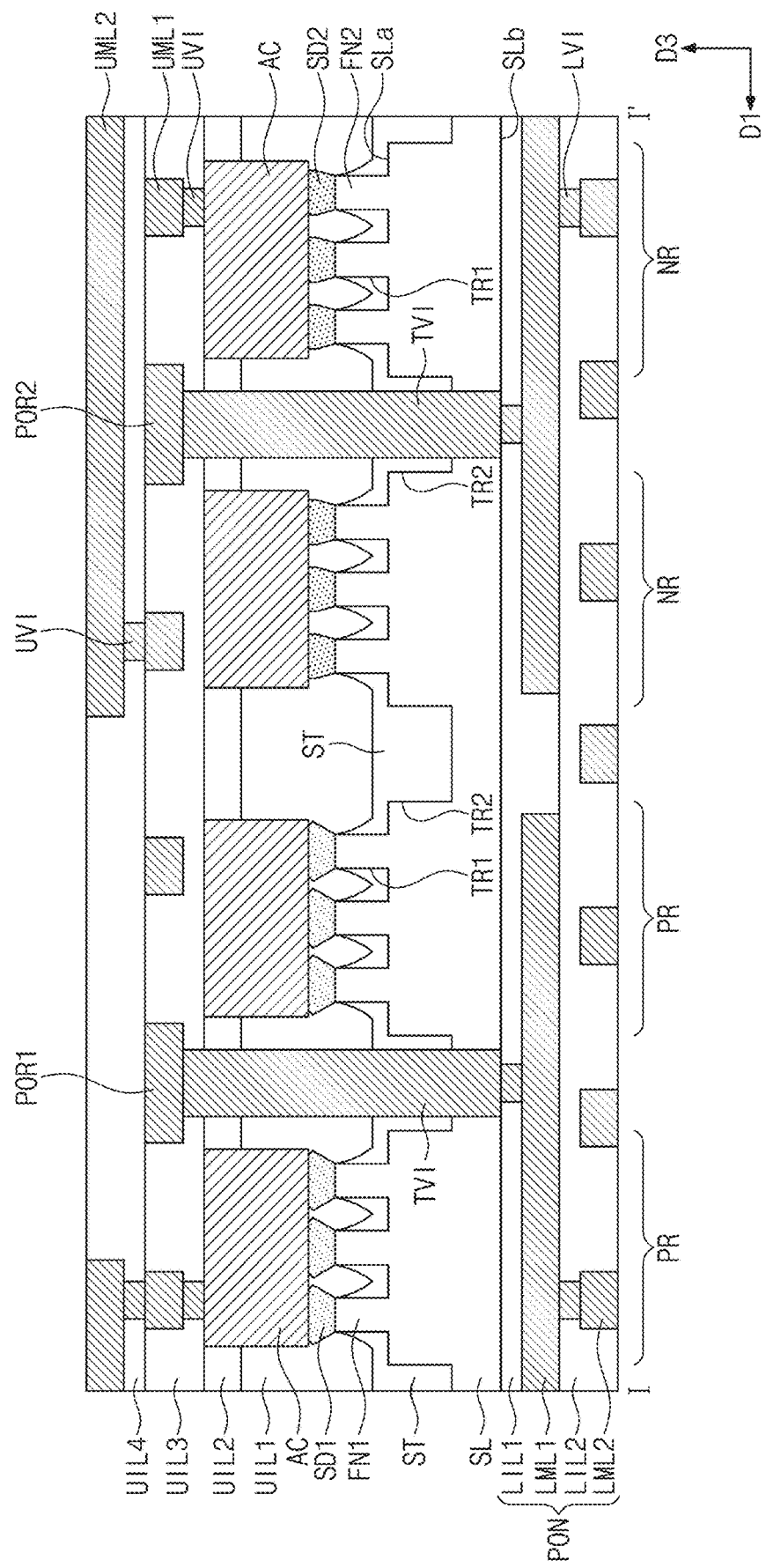
FIGS. 7A and 7B are cross-sectional views taken along lines I-I' and II-II' of FIG. 6, respectively.
Figure 7B:
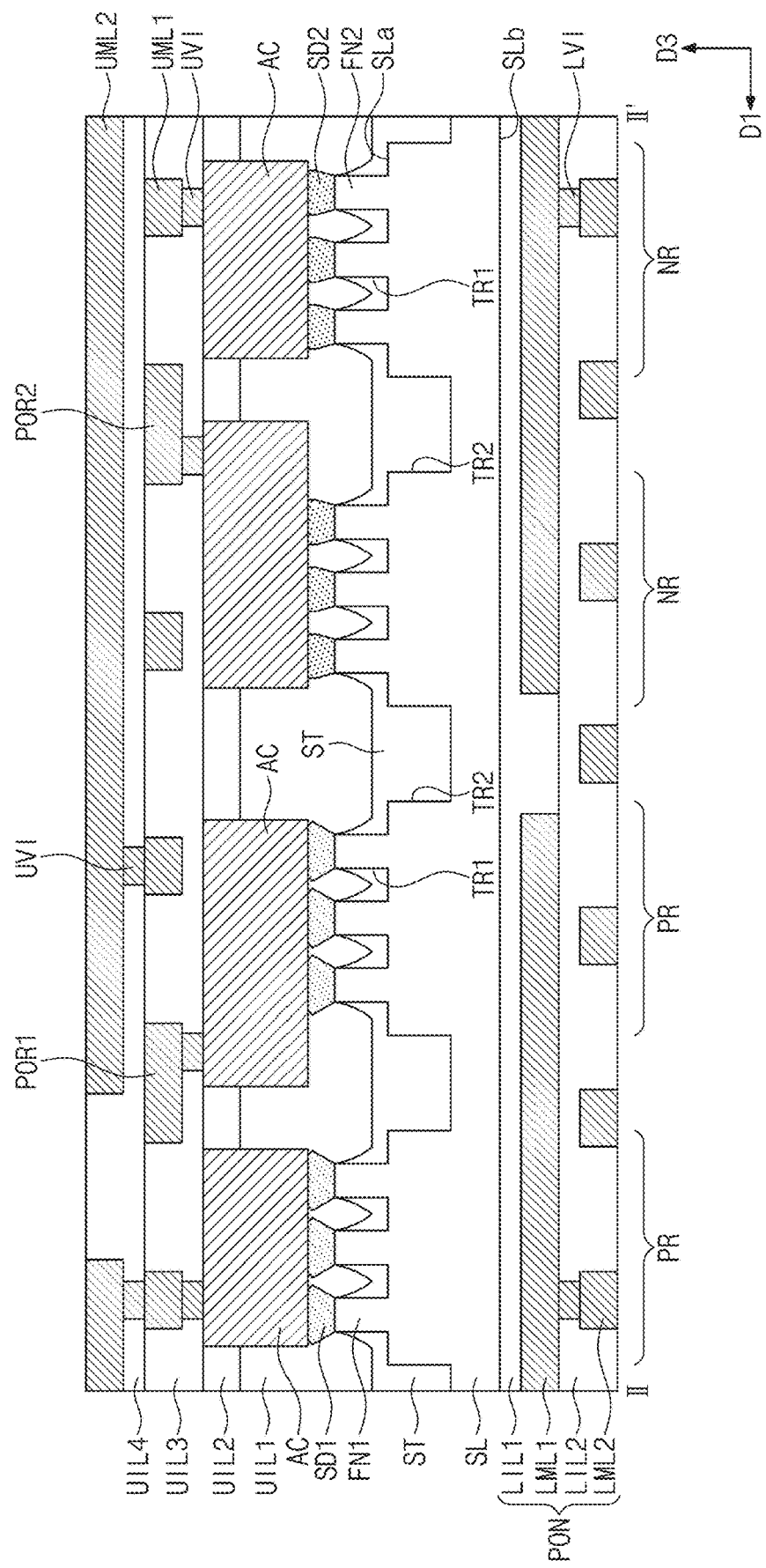

FIG. 6 is a plan view illustrating a semiconductor device according to some example embodiments of the inventive concepts. FIGS. 7A and 7B are cross-sectional views taken along lines I-I' and II-II' of FIG. 6, respectively. In the present example embodiments, the descriptions to the same technical features as in the above example embodiments of FIGS. 1 to 3 will be omitted or mentioned briefly for the purpose of ease and convenience in explanation. In other words, differences between the present example embodiments and the example embodiments of FIGS. 1 to 3 will be mainly described hereinafter.

Referring to FIGS. 6, 7A and 7B, first and/or second power rails POR1 and POR2 may be provided in the third upper insulating layer UIL3. In other words, the first and/or second power rails POR1 and POR2 and/or the first upper interconnection lines UML1 may constitute a first metal layer. The first and/or second power rails POR1 and POR2 may extend in parallel to each other in the second direction D2.

At least one active contact AC may be electrically connected to the first power rail POR1 and/or the second power rail POR2. The at least one active contact AC may be electrically connected to the first power rail POR1 and/or the second power rail POR2 through the upper via UVI thereon.

Through-vias TVI may vertically extend from the second surface SLb of the semiconductor layer SL to the third upper insulating layer UIL3. The through-vias TVI may sequentially penetrate the semiconductor layer SL, the device isolation layer ST, the first upper insulating layer UIL1, and/or the second upper insulating layer UIL2. The through-vias TVI may be electrically connected to the first and/or second power rails POR1 and POR2, respectively. For example, the through-vias TVI may be in direct contact with the first and/or second power rails POR1 and POR2, respectively.

The through-vias TVI may vertically connect the first and/or second power rails POR1 and POR2 of the first metal layer to the power delivery network PON under the semiconductor layer SL. A power voltage (VDD) and/or a ground voltage (VSS) may be applied to the first and/or second power rails POR1 and POR2 through the through-vias TVI, respectively.

In the semiconductor device according to some example embodiments of the inventive concepts, the power delivery network may be stably formed on the second surface SLb of the semiconductor layer SL. As a result, the reliability and/or integration density of the semiconductor device may be improved.

While the inventive concepts have been described with reference to example embodiments, it will be apparent to those skilled in the art that various changes and modifications may be made without departing from the spirits and scopes of the inventive concepts. Therefore, it should be understood that the above example embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A semiconductor device comprising:
   a semiconductor layer having a first surface and a second surface opposite to the first surface;
   an active pattern on the first surface, the active pattern including a source/drain region;
   a power rail electrically connected to the source/drain region; and
   a power delivery network on the second surface, the power delivery network electrically connected to the power rail,
      wherein the semiconductor layer includes an etch stop dopant, and
      the etch stop dopant has a maximum concentration at the second surface.

2. The semiconductor device of claim 1, further comprising:
   a through-via extending from the second surface toward the first surface,
      wherein the through-via electrically connects the power rail to the power delivery network.

3. The semiconductor device of claim 1, wherein the etch stop dopant includes boron (B), carbon (C), or a combination thereof.

4. The semiconductor device of claim 1, wherein the maximum concentration of the etch stop dopant ranges from about 1E18/cm$^3$ to about 5E20/cm$^3$.

5. The semiconductor device of claim 1, wherein
   the semiconductor layer further includes a counter dopant, and
   the counter dopant has a maximum concentration at the second surface.

6. The semiconductor device of claim 5, wherein the counter dopant includes phosphorus (P), arsenic (As), or a combination thereof.

7. The semiconductor device of claim 1, wherein the power delivery network comprises:
   a lower insulating layer on the second surface; and
   a lower interconnection line in the lower insulating layer.

8. The semiconductor device of claim 1, further comprising:
   a device isolation layer on the first surface, the device isolation layer defining the active pattern,
   wherein the power rail is in the device isolation layer.

9. The semiconductor device of claim 1, further comprising:
   an upper insulating layer on the first surface, the upper insulating layer covering the active pattern; and
   an upper interconnection line in the upper insulating layer.

10. The semiconductor device of claim 9, wherein the power rail is in the upper insulating layer.

11. The semiconductor device of claim 1, wherein the source/drain region comprises:
    a first source/drain region; and
    a second source/drain region, wherein
       the first source/drain region has a first lattice constant greater than a second lattice constant of the semiconductor layer, and
       the second source/drain region has the second lattice constant equal to the second lattice constant of the semiconductor layer.

12. The semiconductor device of claim 1, wherein the source/drain region comprises:
    a first source/drain region; and
    a second source/drain region, wherein
    a first cross-sectional shape of the first source/drain region is different from a second cross-sectional shape of the second source/drain region.

13. A semiconductor device comprising:
    a semiconductor layer having a first surface and a second surface opposite to the first surface;
    a transistor on the first surface;
    an upper insulating layer on the transistor;
    an upper interconnection line in the upper insulating layer;
    a lower insulating layer on the second surface; and
    a lower interconnection line in the lower insulating layer,
       wherein the semiconductor layer includes an etch stop dopant, and
       a concentration of the etch stop dopant decreases from the second surface toward the first surface.

14. The semiconductor device of claim 13, wherein the etch stop dopant includes boron (B), carbon (C), or a combination thereof.

15. The semiconductor device of claim 13, wherein
    the etch stop dopant has a maximum concentration at the second surface, and
    the maximum concentration ranges from about 1E18/cm$^3$ to about 5E20/cm$^3$.

16. The semiconductor device of claim 13, wherein
    the semiconductor layer further includes a counter dopant, and
    a concentration of the counter dopant decreases from the second surface toward the first surface.

17. A semiconductor device comprising:
- a semiconductor layer having a first surface and a second surface opposite to the first surface;
- a transistor on the first surface;
- a lower insulating layer on the second surface; and
- a lower interconnection line in the lower insulating layer,
    - wherein the semiconductor layer includes an etch stop dopant, and
    - a concentration of the etch stop dopant increases from the first surface to the second surface, has a maximum value at the second surface, and is drastically reduced in the lower insulating layer.

18. The semiconductor device of claim 17, further comprising:
- a power rail electrically connected to the transistor; and
- a through-via extending from the second surface toward the first surface,
    - wherein the through-via electrically connects the power rail to the lower interconnection line.

19. The semiconductor device of claim 17, wherein the etch stop dopant includes boron (B), carbon (C), or a combination thereof.

20. The semiconductor device of claim 17, wherein
- the semiconductor layer further includes a counter dopant, and
- a concentration of the counter dopant increases from the first surface to the second surface and has a maximum value at the second surface.

* * * * *